United States Patent [19]

Häberlein

[11] 4,063,159
[45] Dec. 13, 1977

[54] ADJUSTING DEVICE FOR MAGNETIC PROBES

[75] Inventor: Peter Häberlein, Reutlingen, Germany

[73] Assignee: Institut Dr. Friedrich Forster, Prufgeratebau, Reutlingen, Germany

[21] Appl. No.: 697,446

[22] Filed: June 18, 1976

[30] Foreign Application Priority Data

June 10, 1975 Germany .............................. 2525751

[51] Int. Cl.² .............................................. G01R 33/02
[52] U.S. Cl. ...................................... 324/260; 324/262
[58] Field of Search ................. 324/34 R, 43 R, 43 G

[56] References Cited

U.S. PATENT DOCUMENTS

| 3,050,679 | 8/1962 | Schonstedt | 324/43 R |
| 3,064,185 | 11/1962 | Ferguson | 324/43 R |
| 3,281,660 | 10/1966 | Studenick | 324/34 R |
| 3,982,179 | 9/1976 | Forster | 324/43 G |

*Primary Examiner*—Robert J. Corcoran
*Attorney, Agent, or Firm*—George J. Netter

[57] ABSTRACT

A magnetic field probe is supported within a hollow base at one end by a resilient spring element and at its other end by a member adjustable to move the probe transversely of the axis defined by the probe ends. The spring element biases the probe in a direction transversely of the probe axis.

8 Claims, 2 Drawing Figures

ADJUSTING DEVICE FOR MAGNETIC PROBES

The invention relates to an adjusting device for magnetic probes having a probe body including a probe element, first and second supporting bodies for mounting the adjusting device in the magnetic probe, with a first support for the movable connection of one end of the probe body with the first supporting body, a second support for the movable connection of the other end of the probe body with the second supporting body, and a setting mechanism within at least one of the two supporting bodies, which setting mechanism enables the adjustment of the respective ends of the probe in a direction substantially normally to the connection axis between the two ends of the probe body.

BACKGROUND OF THE INVENTION

For a long time past, adjusting devices of the general type described have been used in magnetic gradient probes for aligning the two probe elements of a gradient probe into exact parallelism relative to one another or relative to an assumed probe axis. Particularly in cases where gradient probes are part of a magnetic field detector, high precision and constancy are required for the adjusting devices. If, for example, the required resolution is to be in the order of $1\gamma$ ($1\gamma = 10^{-5}$ Oersted), the parallelism must be adjusted with a precision of some seconds of arc, otherwise an indication error corresponding to the required resolution is to be expected on rotation of the probe in the geomagnetic field. An additional impediment exists in that no ferromagnetic materials may be used for the construction of such adjusting devices.

In the previously known adjusting devices, one end of the probe body was connected with one of the supporting bodies by means of a ball-and-socket joint. The second supporting body was provided with a threaded spindle extending in the transverse direction to the probe axis, the thread of which was engaged by a threaded sector secured to the other end of the probe body. To maintain the engagement in any adjusting position, the threaded sector had to be resiliently pressed onto the threaded spindle. For this purpose, it was necessary to support the component carrying the ball socket of the ball-and-socket joint so that it could be moved in the axial direction and to preload it by spring so that the spring force was transmitted to the threaded spindle through the ball-and-socket joint, the probe body and the threaded sector. Furthermore, a radial thrust bearing was required at the end of the probe body facing the threaded spindle to prevent movement of the probe body in a direction other than the desired adjusting direction.

A weighty disadvantage of this known form of adjusting device is, despite its relatively high cost, an improvement of the precision beyond a certain degree cannot be achieved. In particular, slight movements of the probe body cannot be completely avoided when adjusting the spindle. These movements are due to the fact that frictional forces are counteracting the adjustment of the probe body in the desired direction and that the probe core turns aside in the axial direction along the flanks of the threads. At this time the spring force in the axial direction increases. As soon as the spring force has attained the intensity of the frictional forces, the probe body suddenly slides back. To remedy this deficiency, the spring force and the frictional forces must be balanced with one another for each point of the adjusting range. The axial support of the part carrying the ball socket as well as the thrust bearing at the opposite end of the probe body must be manufactured with extremely close tolerances, since even the smallest play offers the possibility of parallelism deviation. The ball head and the ball socket must also be individually manufactured with high precision. Furthermore, in the previous construction, the diameter of the threaded spindle cannot be reduced below a certain degree as would be desirable for the improvement of the smooth running characteristics (fine-pitch).

OBJECTS AND SUMMARY OF THE INVENTION

The object of the invention is to provide a particularly fine-pitch and high-resolution adjusting device which operates practically without play and smoothly over the entire adjusting range, whereby extremely high angular resolutions can be achieved. Thus, for example, in a gradient probe with a base distance of 400 mm, the device easily achieves a parallelization which keeps indication errors below $1\gamma$ during rotation within the geomagnetic field. Moreover, the advantage is obtained that a new parallelization can easily be performed at any time, even if, due to heavy blows, inexpert handling, one-sided temperature influences or aging processes, for example, the geometric shape of the base tube in which the adjusting device is installed has changed. The possibility of the occurrence of strains is prevented by the fact that free sliding of the one end of the probe body in the axial direction is possible. It is further advantageous that the adjusting device according to the invention can be relatively cheaply manufactured. In particular, simple and even certain commercially available components can be used. The assembly also presents no difficulties, since fitting in or fitting together and marking of individual parts is not necessary.

DESCRIPTION OF PREFERRED EMBODIMENTS

Figure 1:
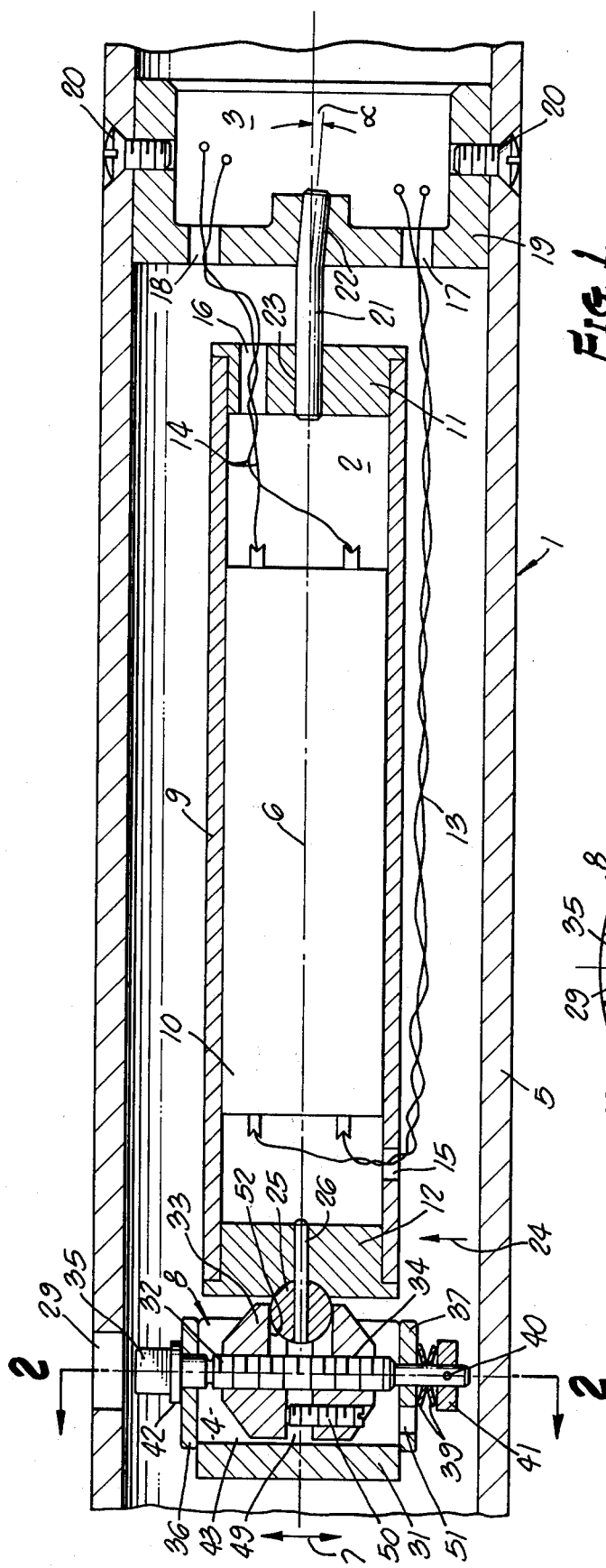
FIG. 1 is an elevational, sectional view of the adjusting device of this invention.

The adjusting device 1 includes a probe body 2 and supporting bodies 3 and 4, all installed within a base tube 5 of a magnetic gradient probe by means of the two supporting bodies. Another adjusting device which corresponds to the above-mentioned adjusting device in all details and which is not represented here is installed into the base tube 5 at a given axial distance from the adjusting device 1, the so-called base distance, and rotated 90° about axis 6 relative to the adjusting device 1. While adjusting device 1 allows adjustment of the angular position of the probe body 2 parallel to the plane of projection in the direction of arrow 7, the other adjusting device not represented here is adjustable vertically to the plane of projection. The probe bodies of the two adjusting devices each contain the two probe elements of the gradient probes which are electrically interconnected in a known manner, the two probe elements being adjustable to exact parallelism by alternate actuation of the two adjusting devices. In the present example, only supporting body 4 comprises a setting mechanism 8. However, it is within the spirit of this invention that supporting bodies 3 and 4 each may comprise a setting mechanism staggered relative to one another by 90° in order to be able to perform a complete parallelism adjustment with one adjusting device only.

The probe body 2 comprises a hollow cylindrical probe tube 9, a probe element 10 installed inside the probe tube and two end portions 11, 12 which shut off the probe tube ends and which are firmly cemented to the probe tube. Wire leads 13, 14 of the probe element 10 are brought out through holes 15, 16 in probe body 2 and through holes 17, 18 in supporting body 3. At the left-hand end of the probe body 2 a ball 25 is cemented into a cavity of the end portion 12 and secured therewithin by pin 26. Ball 25 serves as a radial thrust support for the setting mechanism 8 to be described later on. Instead of the particularly advantageous ball, any other spherical element can also be chosen.

The supporting body 3 includes a turned part 19 which is received within and secured to the base tube 5 by means of screws 20. A movable connection between supporting body 3 and probe body 2 is achieved by a spring wire 21 preferably made of beryllium bronze, which wire has one end portion rigidly inserted into and cemented within an opening 22 of the turned part 19, and its other end portion similarly affixed within an opening 23 of the end portion 11. In the connection between the supporting body 3 and the probe body 2 by means of spring wire 21, a small amount of tension is provided which is either achieved by forming the opening 22 (or 23) at an angle $\alpha$ of some degrees relative to axis 6 or by giving the spring wire 21 a curved or buckled shape prior to hardening. In this manner, a play compensating urging of the left-hand end of the probe body 2 is achieved (i.e., of ball 25), in the direction of arrow 24. The movable resilient connection between supporting body 3 and the probe body can also be realized by another resilient element than the aforementioned spring wire 21, if said element provides two degrees of freedom and prevents movements in the axial direction. The use of a small tube instead of a spring wire 21 is also possible. It is even possible that the resilient element may consist in a part of the probe body 2 or of the supporting body 3, e.g., an extension of the probe tube 9 which is inserted into the supporting body 3 with a predetermined deflection of the probe tube during the actuation of the adjusting device being provided as a result of reduction of the cross-section of the probe tube.

Figure 2:
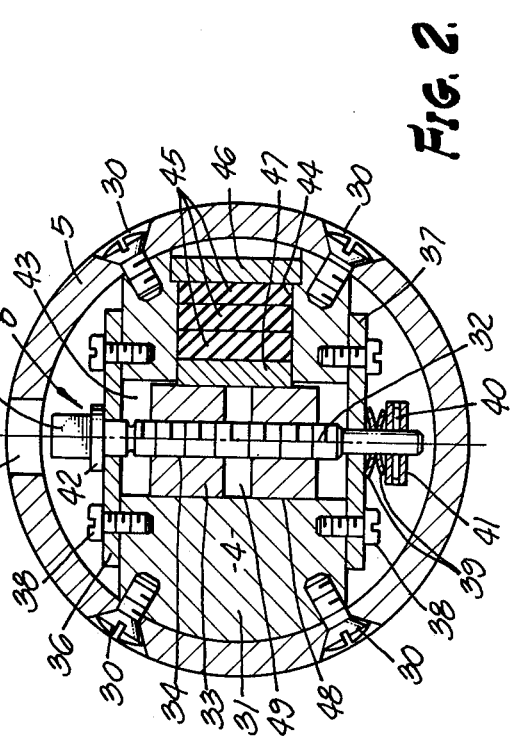
FIG. 2 is a cross-sectional view along the line 2—2 of FIG. 1.

The supporting body 4 of which a section taken along the line 2—2 is shown in detail in FIG. 2, includes a small block 31 retained in the base tube 5 by means of screws 30, and the various parts of the setting mechanism 8 carried by block 31. The most important parts of the setting mechanism 8 are a threaded spindle 32 and a slide 33 which is driven by the thread 34 of spindle 32. A square head 35 on the spindle end permits actuation of the threaded spindle and consequently of the adjusting device by means of a square box wrench, for example. Opening 29 in base tube 5 permits access to the square head 35. As compared to the previous designs the threaded spindle 32 may have a considerably smaller diameter and consequently a correspondingly enhanced quality of fine-pitch operation of the thread because the pressure forces normal to the spindle axis are substantially reduced. The threaded spindle 32 is supported in two sheet metal crossbars 36, 37 which are secured to the block 31 by means of screws 38. Two spring washers 39 act on a disk 41 which is connected to the threaded spindle 32 by means of pin 40. The washers force the shoulder 42 of the threaded spindle 32 against the sheet metal crossbar 36 and in this way prevent axial play of the threaded spindle relative to its support. Slide 33 moves within a groove 43 of block 31. To compensate the play of slide 33 relative to its support three rubber springs 45 are disposed in an opening 44 of block 31, the rubber springs being held by a cover 46 and the rubber springs pressing a slide shoe 47 constructed of tetrafluorethylene against the flank of slide 33 so that the latter is guided along surface 48 of block 31 without play. A further support of slide 33, apart from its guide through threaded spindle, is not provided so that fitting in of the slide is not necessary.

For the play-free connection of the threaded spindle 32 with the female thread 34 of slide 33, an adjustment is provided. For this purpose slide 33 has a slot 49 extending at right angles to the axis of the thread 34 and which also extends completely through from the outside to the threaded hole or even beyond the same. A screw 50 is inserted into slide 33 on the one side of the slot 49 and at right angles to the latter. Its tip rests on the opposite side of the slot so that the slot can be widened by tightening the screw 50. By advancing the screw 50 (which is accessible through a hole 51 in sheet metal crossbar 37), not only is absolute freedom from play between the associated thread flanks of threaded spindle 32 and slide 33 obtained, but, in addition the possibility is also provided to adjust the pressure of the thread flanks, i.e., to set the desired automatic lock of the thread. This result is repeatable by setting the screw 50 to a defined value by means of a torque wrench.

The support of the left-hand end of the probe body 2 relative to the supporting body 4, on the one hand, consists in the ball 25 mounted to the end portion 12, and, on the other hand, in an opening 52 in the side of slide 33 facing the ball. The slide 33 with opening 52 therein serve as a socket for adjustably locating the ball 25, and does not have to be great precision of the opening 52. Due to the initial biasing of ball 25 in the direction of arrow 24, it is not necessary that the ball 25 fit precisely into opening 52. On the contrary, as already mentioned, another form of spherical element can also be used instead of the ball 25. The ball 25 or the spherical element can also be guided by opening 52. The described support does not transmit forces in the axial direction. Thus, it is insured that even in the case of heavy deformations of the base tube 5, binding of the adjusting device is by no means possible, i.e., that in this case parallelism can easily be produced at any time. Due to the fact that the oppositely arranged resilient support by means of spring wire 21 has two degrees of freedom, it is insured that, in directions at right angles to axis 6, the position defined by the prism or the opening 52 in connection with the initial biasing can be obtained at any time.

I claim:
1. A device for adjustably locating a magnetic field probe having two ends within a hollow base, comprising:
   first and second supporting bodies located within said base and affixed to said base at spaced points;
   a resilient element interconnecting one probe end with the first supporting body providing the probe body with at least two resilient degrees of freedom generally at right angles to the axis formed by the two probe ends;

a socket and included spherical element interconnecting the second supporting body and the other probe end, and means for adjusting said socket and included spherical element as a unit transversely of the probe axis and relative to said second supporting body.

2. A device as in claim 1, in which the resilient element is biased to exert a resilient force on the probe body transversely of a line drawn between said first and second supporting bodies.

3. A device as in claim 2, in which the resilient element includes a spring wire.

4. A device as in claim 2, in which the resilient element includes a beryllium bronze wire.

5. A device as in claim 2, in which the resilient element includes a flexed straight wire spring.

6. A device as is claim 1, in which the second supporting body includes a spindle threadedly engaged with the socket and included spherical element, said spindle being adjustable to move the probe other end.

7. A device as in claim 6, in which the spindle is elongated and spring-loaded in a manner resiliently urging the spindle along its long dimension.

8. A device as in claim 1, in which there are further provided means for selectively adjusting securing pressure of the socket on the included spherical element.

* * * * *